(12) United States Patent
Furuta et al.

(10) Patent No.: US 6,313,504 B1
(45) Date of Patent: Nov. 6, 2001

(54) VERTICAL MOS SEMICONDUCTOR DEVICE

(75) Inventors: Kenichi Furuta, Miyazaki; Yutaka Akiyama; Osamu Kawai, both of Tokyo, all of (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/525,329

(22) Filed: Mar. 13, 2000

(30) Foreign Application Priority Data

Aug. 31, 1999 (JP) .................................................. 11-245618

(51) Int. Cl.[7] .......................... H01L 29/76; H01L 29/94; H01L 31/062; H01L 31/113; H01L 31/119
(52) U.S. Cl. .......................... 257/335; 257/336; 257/337; 257/341
(58) Field of Search ..................................... 257/327, 335, 257/336, 337, 338, 339, 341, 342

(56) References Cited

U.S. PATENT DOCUMENTS

| | | | |
|---|---|---|---|
| 5,208,471 | * | 5/1993 | Mori et al. ............................ 257/327 |
| 5,525,821 | * | 6/1996 | Harada et al. ........................ 257/331 |
| 6,040,601 | * | 3/2000 | Gong et al. ........................... 257/341 |
| 6,049,104 | * | 4/2000 | Hshieh et al. ......................... 257/328 |
| 6,060,744 | * | 5/2000 | Kuwahara et al. .................... 257/328 |
| 6,114,726 | * | 9/2000 | Barkhordarian ....................... 257/341 |

FOREIGN PATENT DOCUMENTS 8-167713   6/1996   (JP) .

* cited by examiner

*Primary Examiner*—Ngân V. Ngô
(74) *Attorney, Agent, or Firm*—Jones Volentine, PLLC

(57) ABSTRACT

A vertical MOS semiconductor device in accordance with the present invention is provided with a semiconductor base; and a vertical MOS transistor having a well diffusion layer of a conductive type opposite to that of the semiconductor base, and a source diffusion layer of the same conductive type as that of the semiconductor base; wherein a channel length in a horizontal direction with respect to a main surface of the semiconductor base from a junction of the source diffusion layer to a junction of the well diffusion layer is set such that it is larger than a length at which a punch-through phenomenon takes place between the semiconductor base and the source diffusion layer and at which a minimum resistance value of the well diffusion layer is obtained. This arrangement makes it possible to reduce the size of the entire vertical MOS semiconductor device to 90% as compared with a conventional vertical MOS semiconductor device, without sacrificing a high breakdown voltage characteristic.

3 Claims, 7 Drawing Sheets

VERTICAL MOS SEMICONDUCTOR DEVICE

BACKGROUND OF THE INVENTION

1. Field of the Invention

The present invention relates to an LSI semiconductor device and, more particularly, to a vertical MOS semiconductor device.

2. Description of Related Art

FIG. 6A and FIG. 6B are a sectional view and a top plan view, respectively, of a conventional vertical metal-oxide-semiconductor (MOS) device. FIG. 6A is the sectional view taken at the line C-D of FIG. 6B. FIG. 6B does not show an aluminum wire 24 which will be discussed hereinafter. The vertical MOS semiconductor device is comprised of a cell region 100 wherein a plurality of vertical MOS transistors are formed, and a peripheral region 110 wherein elements for providing a high breakdown voltage characteristic are formed. In a chip of this semiconductor device, the peripheral region 110 is positioned to surround the cell region 100. Referring to FIG. 6A, p-type diffusion regions 12, N⁺ source diffusion regions 14, and p-type take-out regions 16 are provided in an N⁻ epitaxial layer 10 formed on a main surface of an N⁺ substrate 9. Provided on the main surface of the N⁻ epitaxial layer 10 are an insulating film 18, gate oxide films 20, gate electrodes 22, and aluminum wires 24. A gold (Au) electrode 26 is provided on a rear surface of the N⁺ substrate 9. Gates, sources, and drains are connected to the poly-silicon electrodes 22, the aluminum wire 24, and the gold electrode 26, respectively.

Referring to FIG. 7, a manufacturing method for the conventional vertical MOS semiconductor device will be described.

As shown in FIG. 7A, on the main surface of the N⁻ epitaxial layer 10 formed on the N⁺ substrate 9, the insulating film 18 is formed in the peripheral region 110 by the local oxidation of silicon. Thereafter, gate oxide films 20 are formed by thermal oxidation on the main surface of the N⁻ epitaxial layer 10 of the cell region 100. To form the gate electrodes 22, a phosphor-doped poly-silicon film is formed by the low-pressure chemical vapor deposition (CVD) on the gate oxide films 20. This phosphor-doped poly-silicon is subjected to a photolithography process and an etching process to form the predetermined gate electrodes 22. Using the gate electrodes 22 as masks, exposed surfaces of the gate oxide films 20 are etched. Next, a predetermined dosage of a p-type impurity ions are injected into the exposed N⁻ epitaxial layer 10 at a predetermined acceleration energy in an ion injection process. Then, the p-type diffusion regions 12 are formed in the cell region 100 and the peripheral region 110 by heat treatment. This condition is illustrated in FIG. 7B. To secure the high breakdown voltage characteristic, it is necessary to sufficiently ease a concentration of electric field s at a junction of the p-type diffusion region of the peripheral region 110. For the purpose of securing the high breakdown voltage characteristic, a junction depth Xj of the p-type diffusion regions 12 is set, for example, to 4 to 7 $\mu$m.

There are, for example, two other methods for securing the high breakdown voltage characteristic. In one method, the cell region 100 is masked using a resist film, and highly accelerated energy ion injection is performed to form deeper p-type diffusion regions than before in the peripheral area 110. In another method, a guard ring is formed in the peripheral region 110.

Subsequently, as shown in FIG. 7C, the p-type take-out regions 16 composed of the N+ source diffusion regions 14 and the p-type take-out regions 16 composed of a P⁺ diffusion layers are formed by an ion injection process and a heat treatment process. An aluminum alloy is deposited on the exposed p-type take-out regions 16, and the aluminum alloy is formed into the aluminum wire 24 of a predetermined pattern by a photolithography and etching process. A metal, namely, gold is deposited on a rear surface of the N⁺ substrate 9 to form the gold electrode 26. The state is illustrated in FIG. 7D.

In the vertical MOS semiconductor device described above, the junction depth Xj of the diffusion layer of the p-type diffusion regions 12 of the vertical MOS transistor of the cell region 100 is also 4 $\mu$m or more. A channel length L, which is a diffusion length in the horizontal direction of the p-type diffusion region 12 shown in FIG. 7D must be set to a large value, namely, 3 $\mu$m or more.

The large channel length L (3 $\mu$m or more) makes it impossible to reduce channel resistance. To reduce an on-resistance, a chip of the vertical MOS semiconductor device must be larger to make the cell region 100 layer. For this reason, applying a vertical MOS semiconductor device with lower on-resistance to an output section of another semiconductor device, such as a relay, would result in a larger package of a semiconductor device on which a plurality of the vertical MOS semiconductor devices are mounted. This has been posing a problem in that a semiconductor device equipped with the vertical MOS semiconductor devices cannot be reduced in size and weight. Furthermore, it has been difficult to reduce the junction depth of a diffusion layer of the p-type diffusion regions 12 of the peripheral region 110 because of a required high breakdown voltage characteristic.

SUMMARY OF THE INVENTION

Accordingly, an object of the present invention is to reduce a size of a vertical MOS transistor to thereby make the entire vertical MOS semiconductor device without sacrificing a conventional high breakdown voltage characteristic.

According to the present invention, there is provided a vertical MOS semiconductor device comprising: a semiconductor base; and a vertical MOS transistor having a well diffusion layer of a conductive type opposite to that of the semiconductor base, and a source diffusion layer of the same conductive type as that of the semiconductor base; wherein a channel length of the vertical MOS transistor is set such that it is larger than a length at which a punch-through phenomenon takes place between the semiconductor base and the source diffusion layer and at which a minimum resistance value of the well diffusion layer is obtained.

BRIEF DESCRIPTION OF THE DRAWINGS

FIG. 2A and FIG. 2B are sectional schematic diagrams showing resistance values obtained when a vertical MOS transistor is ON.

DETAILED DESCRIPTION OF THE PREFERRED EMBODIMENTS

An embodiment in accordance with the present invention will be described in detail in conjunction with FIG. 1 through FIG. 4.

Figure 1A:
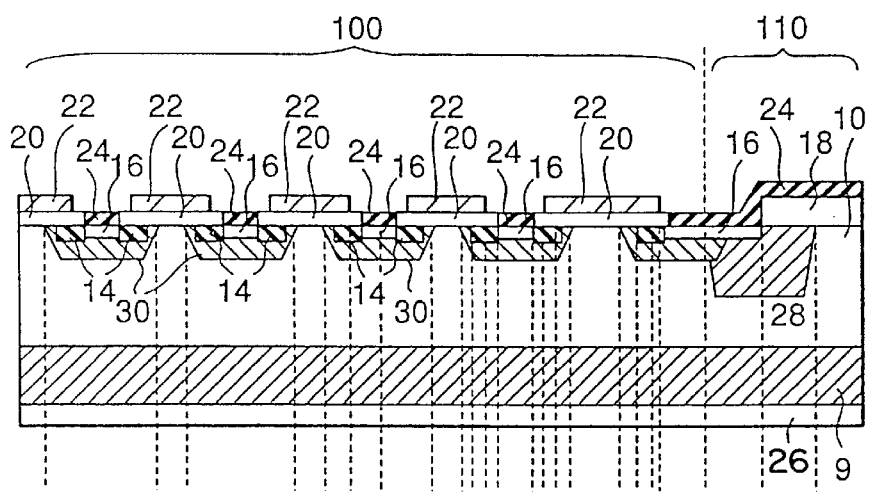
FIG. 1A is a sectional view of a semiconductor device in accordance with an embodiment of the present invention.
Figure 1B:
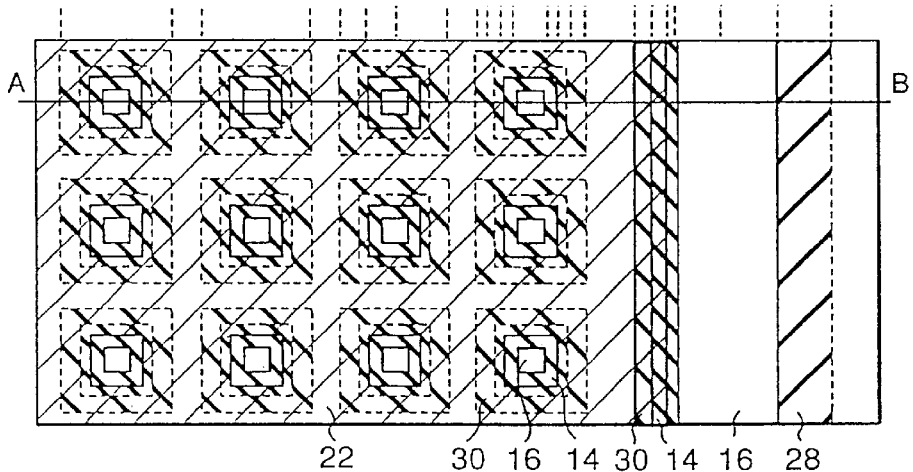
FIG. 1B is a top plan view of the semiconductor device in accordance with the embodiment of the present invention.

FIG. 1A shows a sectional configuration of a vertical MOS semiconductor device in accordance with the present invention, and FIG. 1B is a top plan view thereof. The sectional configuration shown in FIG. 1A is taken at the line A-B of FIG. 1B. For easy understanding of a planar pattern, FIG. 1B does not show an aluminum wire which will be discussed hereinafter.

Referring to FIG. 1A, a first p-type diffusion layer region 28, second p-type diffusion regions 30, N$^+$ source diffusion regions 14, which are source diffusion layers, and p-type take-out regions 16 are present in an N$^-$ epitaxial layer 10, which is a semiconductor base formed on a main surface of an N$^+$ substrate 9. Provided on the main surface of the N$^-$ epitaxial layer 10 are an insulating layer 18, gate oxide films 20, gate electrodes 22, and aluminum wires 24. A gold electrode 26 is provided on the rear surface of the N$^+$ substrate 9. In this embodiment of the present invention, the second p-type diffusion regions 30, which are well diffusion layers, are formed. A gate, a source, and a drain are connected to the gate electrode 22, the aluminum wire 24, and the gold electrode 26, respectively. A diffusion depth Xj of a diffusion layer of the first p-type diffusion region 28 of a peripheral region 110 is set to a conventional range of 4 to 7 μm. On the other hand, the depth Xj of a diffusion layers of the second p-type diffusion regions 30 of a cell region 100 is set to be smaller than that of the first p-type diffusion region 28 of the peripheral region 110.

Figure 2A:
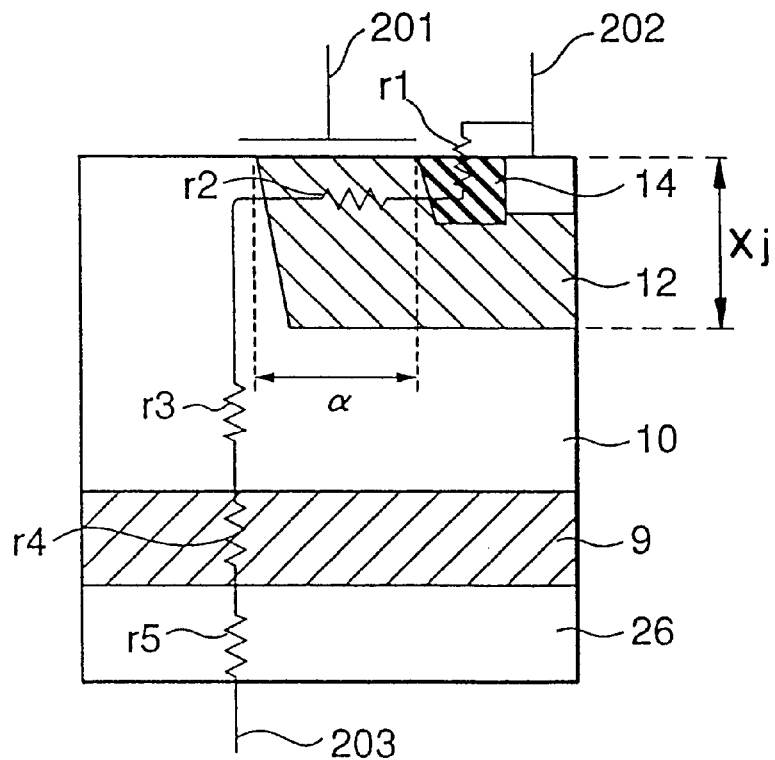
Figure 2B:
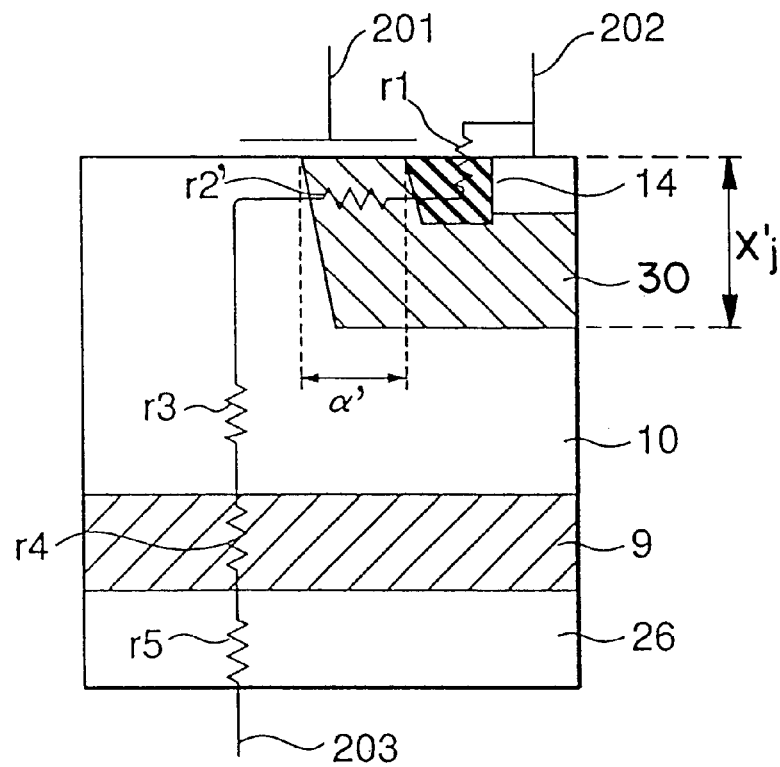

For an explanatory purpose, FIG. 2 provides a schematic sectional view that shows resistance components. FIG. 2A illustrates a case of a prior art, and FIG. 2B illustrates a case of the embodiment in accordance with the present invention. Reference numerals 201, 202, and 203 denote connection to the gate, the source, and the drain, respectively. Referring now to FIG. 2A, r1, r2, r3, r4, and r5 denote resistance values of the N$^+$ source diffusion regions 14, the p-type diffusion regions 12, the N$^-$ epitaxial layer 10, the N$^+$ substrate 9, and the gold electrode 26, respectively, when the vertical MOS transistor in the cell region 100 is ON. A dimension α denotes a diffusion length of the p-type diffusion regions 12 in the horizontal direction, that is, a channel length. The junction depth X$_j$ of the p-type diffusion regions 12 is shown also in FIG. 2A.

Similarly, in FIG. 2B, r1, r2', r3, r4, and r5 denote the resistance values of the N$^+$ source diffusion regions 14, the second p-type diffusion regions 30, the N$^-$ epitaxial layer 10, the N$^+$ substrate 9, and the gold electrode 26, respectively, when the vertical MOS transistor in the cell region 100 is ON. A dimension α' denotes a diffusion length of the second p-type diffusion regions 30 in the horizontal direction, that is, a channel length. As set forth above, the junction depth Xj of the diffusion layer of the second p-type diffusion regions 30 of the embodiment is set to be smaller than that of the p-type diffusion regions 12 of the conventional art (X$_j$ of FIG. 2($a$), i.e. X$_j$>X$_j$'); therefore, the dimension α is larger than the dimension α' (α>α'). A resistance value is proportional to a dimension, so that r2 is larger than r2'.

Furthermore, an on-resistance R$_{on}$ of a vertical MOS transistor is represented by a sum of values of series resistance from a drain to a source in a state wherein the transistor is ON. In other words, the ON resistance R$_{on}$ when the transistor is ON indicates a sum of r1 through r5. The case of the prior art of FIG. 2A and the case of the embodiment of the present invention of FIG. 2B share r1, r3, r4, and r5. A sum of r1, r3, r4, and r5 is denoted by R$_{others}$. When the on-resistance R$_{on}$ of the case of the prior art is denoted by R1, and the on-resistance R$_{on}$ of the case of the embodiment of the present invention is denoted by R2, then R1 and R2 will be expressed as follows:

$$R1 = r2 + R_{others} \quad (1)$$

$$R2 = r2' + R_{others} \quad (2)$$

Since r2 is larger than r2' (r2>r2'), R1 is larger than R2 (R1>R2) from the above expressions (1) and (2).

This means that reducing the channel length reduces the resistance component of the second p-type diffusion regions 30, making it possible to reduce the on-resistance when the vertical MOS transistor is ON.

Referring now to FIG. 3, a manufacturing method for the vertical MOS semiconductor device of the embodiment of the present invention will now be described.

Figure 3A:
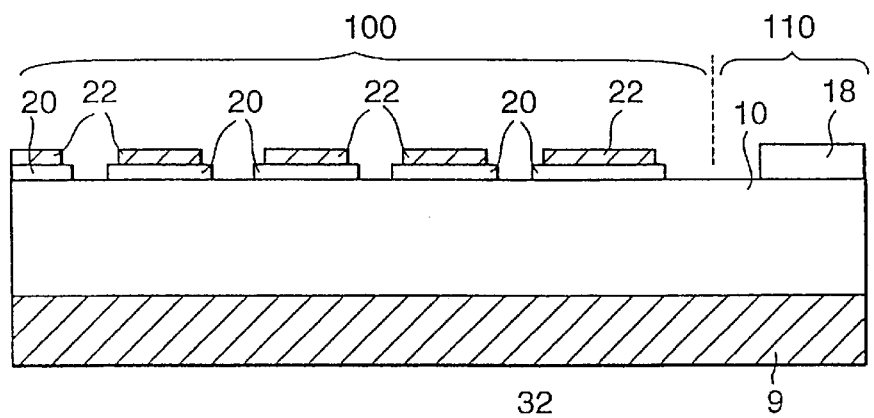
FIG. 3A through FIG. 3C are sectional configuration diagrams illustrating a manufacturing method for the semiconductor device in accordance with the embodiment of the present invention.

As shown in FIG. 3A, on the main surface of the N$^-$ epitaxial layer 10 formed on the N$^+$ substrate 9, the insulating film 18 is formed to a thickness of 1 to 2 μm in the peripheral region 110 by the local oxidation of silicon. Thereafter, gate oxide films 20 are formed by thermal oxidation to a thickness of 100 to 200 nm on the main surface of the N$^-$ epitaxial layer 10 of the cell region 100. To form the gate electrodes 22, a phosphor-doped poly-silicon film is formed to a thickness of 200 to 500 nm by the CVD on the gate oxide films 20. This phosphor-doped poly-silicon film is subjected to a photolithography process and an etching process to form the gate electrodes 22 of predetermined patterns. Using the gate electrodes 22 as masks, exposed surfaces of the gate oxide films 20 are etched.

Figure 3B:
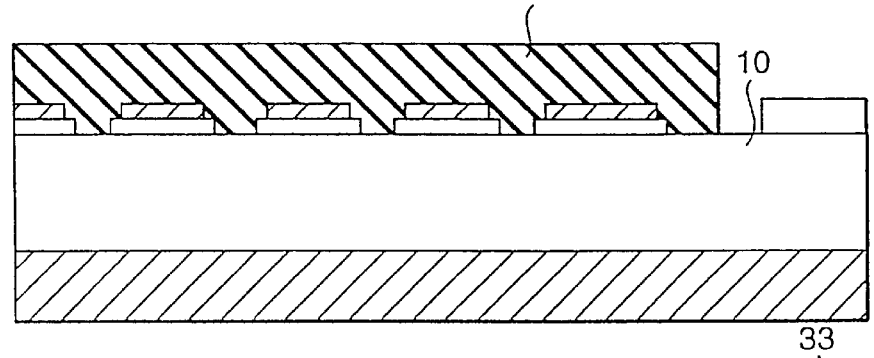

Subsequently, as shown in FIG. 3B, in the embodiment of the present invention, a predetermined region that includes the cell region 100 is masked by a resist 32 in a photolithography process. Then, boron ions, which are p-type impurity ions, are injected in the exposed N$^-$ epitaxial layer 10 under a condition wherein the acceleration energy is 40 to 120 KeV and an injection dosage of 5E12 to 5E13 cm$^{-2}$. In the following step, the resist 32 is removed, and the N$^-$ epitaxial layer 10 that includes the ion-injected region is subjected to heat treatment performed at 1000 to 1200 degrees centigrade in a nitrogen atmosphere for 60 to 120 minutes. This produces a shallow diffusion layer 31 for forming the first p-type diffusion region 28, which will be discussed later, in the peripheral region 110.

Figure 3C:
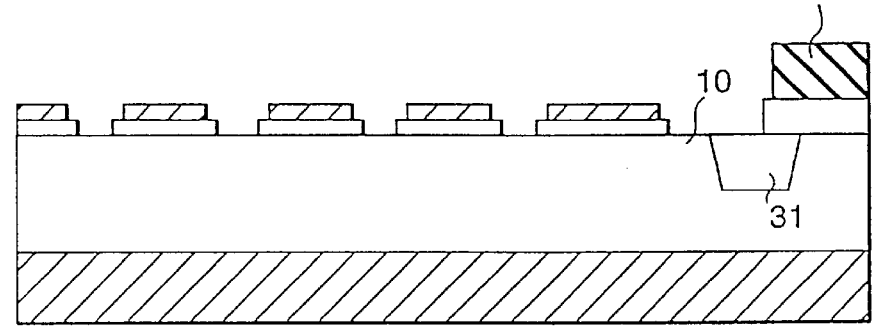

Furthermore, as shown in FIG. 3C, a predetermined region of the peripheral region 110 is masked by a resist 33 by the photolithography. Thereafter, p-type impurity ions are injected in the exposed N$^-$ epitaxial layer 10 in an ion injection process. The same condition ranges as those of the ion injection performed for forming the aforesaid shallow diffusion layer 31 may apply to this ion injection.

Figure 4D:
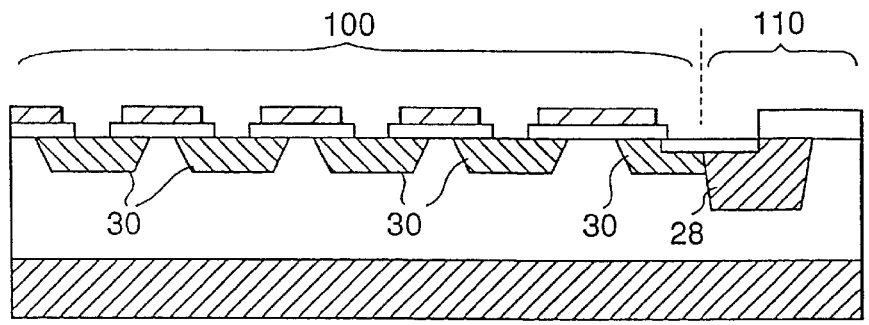
FIG. 4D through FIG. 4F are sectional configuration diagrams that follow FIG. 3C, and illustrate the manufacturing method for the semiconductor device in accordance with the embodiment of the present invention.

Subsequently, following the removal of the resist 33, the N⁻ epitaxial layer 10 that includes the ion-injected region is subjected to heat treatment carried out at 900 to 1200 degrees centigrade in a nitrogen atmosphere for 60 to 120 minutes. As illustrated in FIG. 4D, the shallow diffusion layer 31 shown in FIG. 3C only is further diffused to form the first p-type diffusion region 28 in the peripheral regions 110. In the cell region 100, the second p-type diffusion region 30 is formed. In the peripheral region 110, a region wherein the first p-type diffusion region 28 and the second p-type diffusion region 30 overlap each other is indicated as the first p-type diffusion region 28. The junction depth (Xj') of the diffusion layer of the second p-type diffusion region 30 is formed so that it is smaller than that of the first p-type diffusion region 28.

Figure 4E:
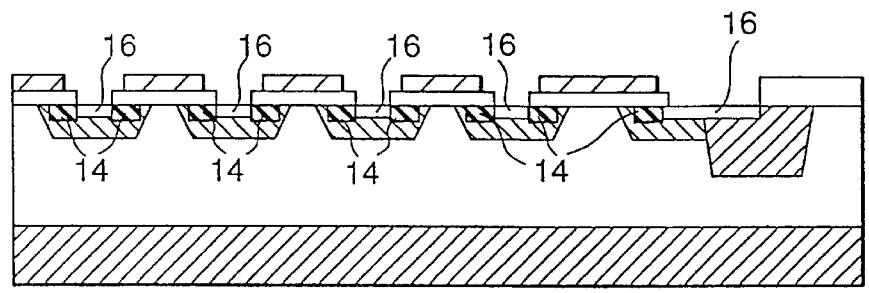
Figure 4F:
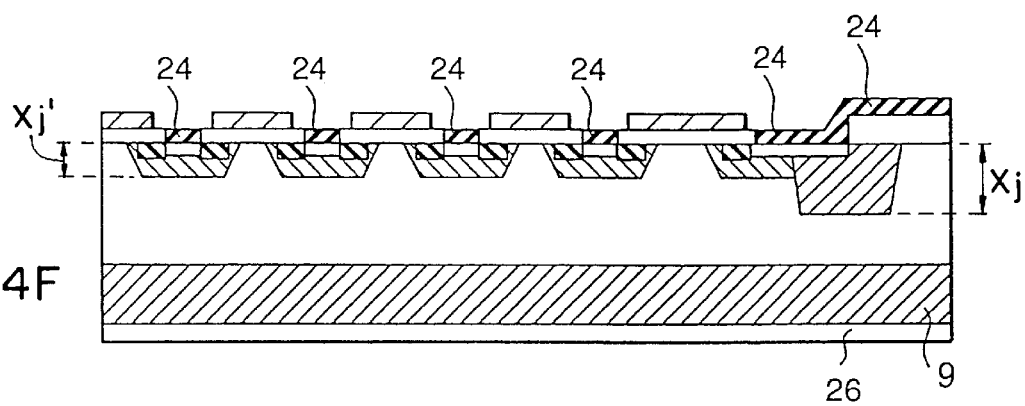

Thereafter, as shown in FIG. 4E, the N⁺ source diffusion region 14 and the p-type take-out region 16 are formed by ion injection and heat treatment in the first p-type diffusion region 28 or the second p-type diffusion region 30. An aluminum alloy is deposited on the exposed p-type take-out region 16. Furthermore, as shown in FIG. 4F, the aluminum alloy is formed into, the aluminum wire 24 of a predetermined pattern by a photolithography and etching process. Gold is deposited as a metal to form the gold electrode 26 on a rear surface of the N⁺ substrate 9.

Two characteristic evaluations were performed with the vertical MOS transistor in the cell region 100 in the vertical MOS semiconductor device produced by the manufacturing method. The first evaluation was carried out on a relationship between a channel length and on on-resistance, and the second evaluation was carried out on a relationship between the channel length of the vertical MOS transistor and a source-drain breakdown voltage. The following will describe results of the evaluations.

For the vertical MOS semiconductor device, an N⁻ epitaxial layer substrate having a specific resistance of 10 Ω·cm was used. A threshold voltage (hereinafter referred to as "Vt") of the vertical MOS transistor was defined as follows. The source was connected to the ground, the gate and the drain were connected, and a positive voltage applied to the gate and drain was gradually increased. A gate voltage at which a value of current flowing between the source and the drain becomes 1 μA was denoted as Vt. In general, Vt is dependent mainly on a type of a material of the gate, a charge density of an interface of a channel region, a thickness of a gate oxide film, and an impurity concentration. The impurity concentration can be finely adjusted by controlling ion injection.

Figure 5A:
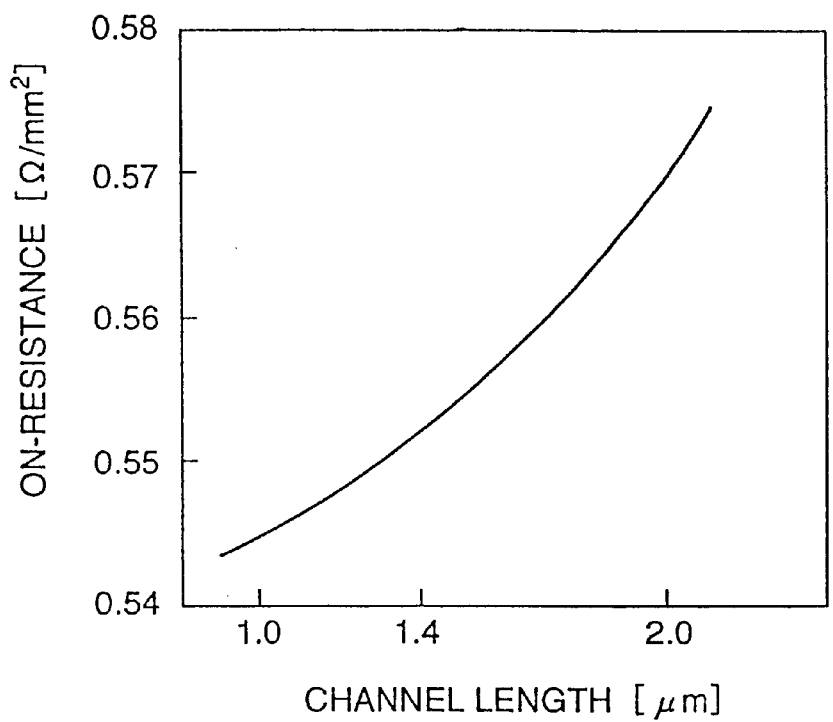
FIG. 5A is a graph illustrating a relationship between a channel length and on-resistance per unit area.

FIG. 5A provides a graph showing a relationship between a channel length and an on-resistance of the vertical MOS transistor. In the graph, an axis of abscissa indicates the channel length, and the axis of ordinates indicates values of on-resistance per unit area (unit: Ω/mm²). The values of the on-resistance per unit area are obtained by dividing on-resistance R2 by a chip area. In the graph, as the channel length increases, the on-resistance per unit area linearly increases. Therefore, it can be seen that the channel length should be smaller to reduce the on-resistance. In other words, a channel length at which a minimum on-resistance is obtained is the best.

Figure 5B:
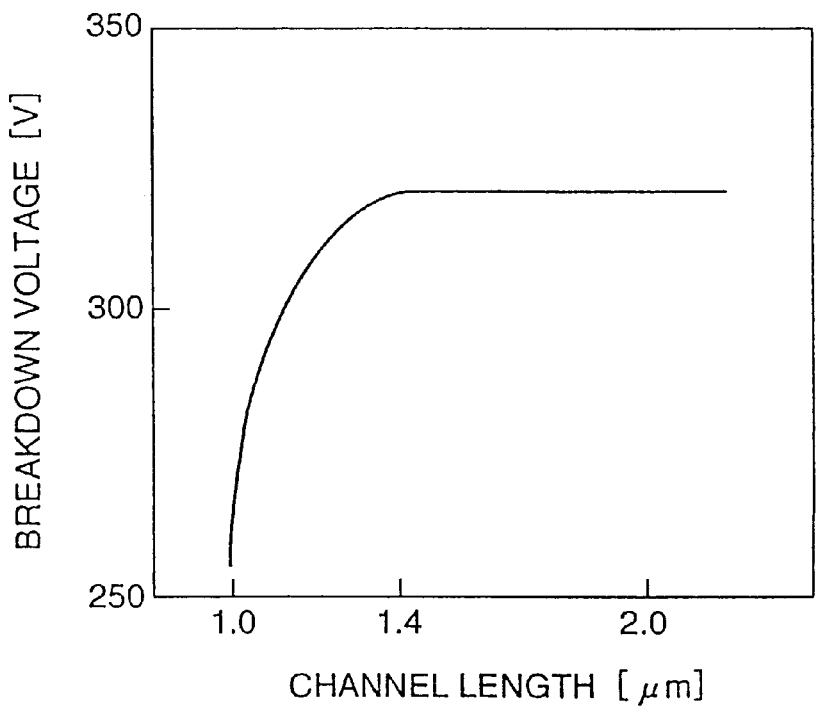
FIG. 5B is a graph illustrating a relationship between the channel length and a source-drain breakdown voltage.
Figure 6A:
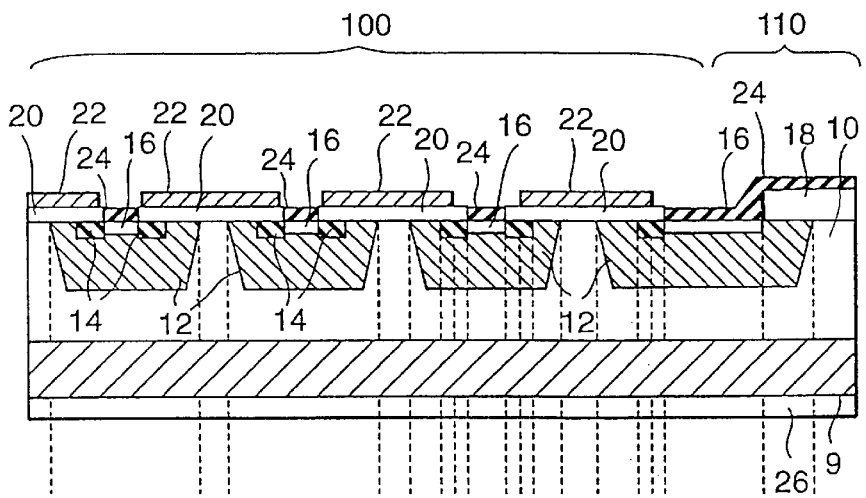
FIG. 6A is a sectional view of a semiconductor device according to a conventional art.
Figure 6B:
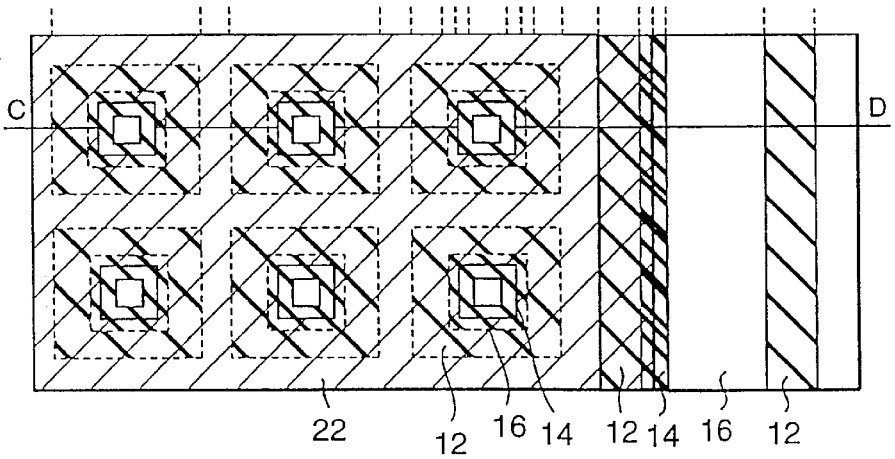
FIG. 6B is a top plan view of the semiconductor device according to the conventional art.
Figure 7A:
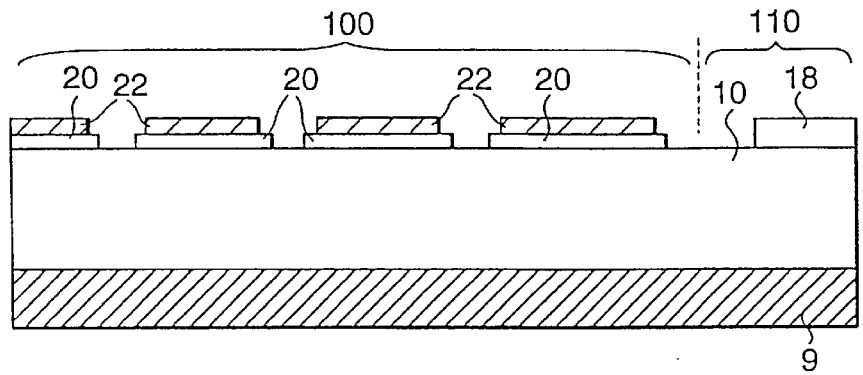
FIG. 7 is a sectional configuration diagram illustrating a manufacturing method for the semiconductor device according to the conventional art.
Figure 7B:
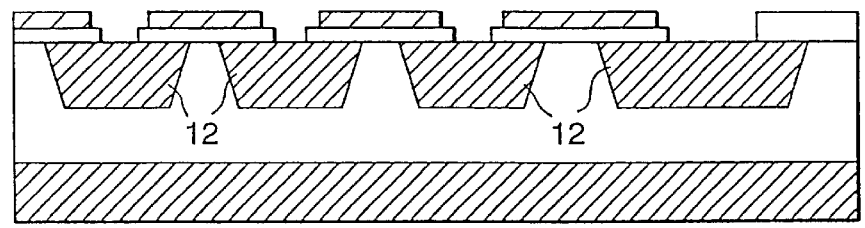
Figure 7C:
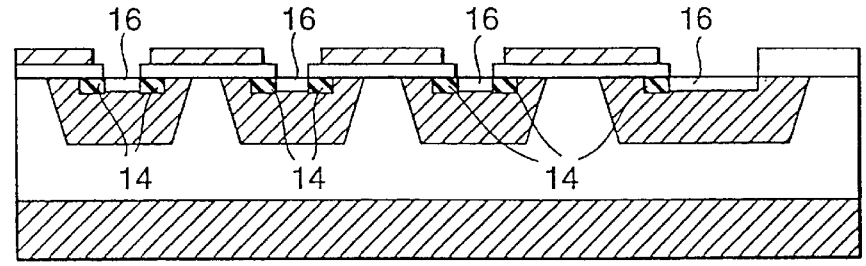
Figure 7D:
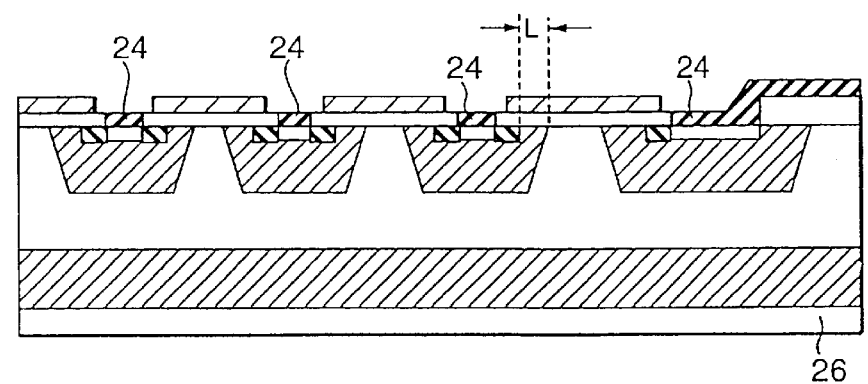

FIG. 5B is a graph showing a relationship between the channel length and the source-drain breakdown voltage of the vertical MOS transistor. The axis of abscissa indicates the channel length, and the axis of ordinates indicates the source-drain breakdown voltage. During the evaluation, the source and the gate were connected to the ground, and a positive voltage applied to the drain was gradually increased, and current flowing between the drain and the ground was measured. A value of the voltage applied to the drain at which the current reaches a predetermined value is a source-drain breakdown voltage value. Referring to the graph of FIG. 5B, the breakdown voltage value suddenly decreases at a channel length smaller than 1.4 μm. This means that a depletion layer extending from an interface between the second p-type diffusion regions 30 and the N⁻ epitaxial layer 10 reaches the N⁺ source diffusion regions 14, leading to the "punch-through phenomenon" in which current passes between the drain and the source. Hence, based on the graph of FIG. 5B, a channel length exceeding 1.4 μm is more preferable since it is larger than the length at which the punch-through phenomenon takes place.

Thus, based on the results shown in the graphs of FIG. 5A and FIG. 5B, it can be understood that the best channel length is approximately 1.4 μm. In a vertical MOS transistor having a channel length of 1.4 μm, a measurement result indicated Vt of approximately 1.2 V.

If Vt has to be further increased to approximately 5.0 V, the resistance of a channel region must be increased. This can be achieved by increasing the concentration of a p-type impurity in the p-type diffusion region as set forth above. It is, however, possible to increase the channel length to 2.0 μm by heat treatment, without the need for increasing the impurity concentration. More specifically, based on the graph of FIG. 5A, when the channel length is set to 1.4 to 2.0 μm, the on-resistance per unit area may range from 0.55 to 0.57 Ω/mm².

Thus, setting the channel length to 1.4 to 2.0 μm enables the vertical MOS transistor to be operated on Vt ranging from 1 to 5 V, without the need for a major change in manufacturing conditions.

Setting the channel length to 1.4 to 2.0 μm as compared with the conventional channel length, 3 μm, provides the following advantages.

The shorter channel length permits lower channel resistance, so that the on-resistance when the vertical MOS transistor is ON can be reduced. A pattern area of a vertical MOS transistor in a cell region can be decreased without changing the number of the vertical MOS transistors in the cell region. Hence, a size of an entire chip of the vertical MOS semiconductor device can be reduced to about 90% as compared with a conventional chip without sacrificing a high voltage breakdowm characteristic.

A package of a semiconductor device on which a vertical MOS semiconductor device in accordance with the present invention is mounted, such as a relay, can be made smaller than a conventional package. This means that the semiconductor device on which the vertical MOS semiconductor device in accordance with the present invention can be reduced in size and weight.

The present invention can be also applied to a p-type vertical MOS transistor formed using a P⁺ substrate on which a P⁻ epitaxial layer is deposited. However, in such a p-type vertical MOS transistor, Vt ranges from −5 to −1 V. In other words, an absolute value of Vt of the vertical MOS transistor ranges from 1 to 5 V.

The present invention can be further applied to a MOS transistor wherein a drain is formed in the vicinity of a surface of a semiconductor substrate.

What is claimed is:

1. A vertical MOS semiconductor device, comprising:
   a semiconductor base which includes a cell region and a peripheral region, wherein the semiconductor base is comprised of a first conductivity type;

a plurality of cell wells disposed in the cell region of the semiconductor base, wherein each of the cell wells is comprised of a second conductivity type opposite to the first conductive type;

a plurality of cell transistors, each cell transistor formed in a corresponding one of the cell wells; and a peripheral well which is formed in the peripheral region, wherein the peripheral well is comprised of the second conductive type, and wherein a depth of each of the cell wells is shallower than that of the peripheral well, and wherein the depth of the peripheral well ranges from 4 to 7 $\mu$m.

2. A vertical MOS semiconductor device, comprising:

a semiconductor base which includes a cell region and a peripheral region, wherein the semiconductor base is comprised of a first conductivity type;

a plurality of cell wells disposed in the cell region of the semiconductor base, wherein each of the cell wells is comprised of a second conductivity type opposite to the first conductive type;

a plurality of cell transistors, each cell transistor formed in a corresponding one of the cell wells; and a peripheral well which is formed in the peripheral region, wherein the peripheral well is comprised of the second conductive type, and wherein a depth of each of the cell wells is shallower than that of the peripheral well, and wherein a channel length of the cell transistor ranges from 1.4 to 2.0 $\mu$m.

3. The vertical MOS semiconductor device according to claim 2, wherein an absolute value of a threshold voltage of the cell transistor ranges from 1 V to 5 V.

* * * * *